United States Patent
Steimle et al.

(10) Patent No.: US 9,637,372 B2
(45) Date of Patent: May 2, 2017

(54) BONDED WAFER STRUCTURE HAVING CAVITIES WITH LOW PRESSURE AND METHOD FOR FORMING

(71) Applicant: FREESCALE SEMICONDUCTOR, INC., Austin, TX (US)

(72) Inventors: Robert F. Steimle, Austin, TX (US); Aaron A. Geisberger, Austin, TX (US); Jeffrey D. Hanna, Spicewood, TX (US); Ruben B. Montez, Cedar Park, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/697,081

(22) Filed: Apr. 27, 2015

(65) Prior Publication Data

US 2016/0311676 A1    Oct. 27, 2016

(51) Int. Cl.
*H01L 23/498* (2006.01)
*H01L 23/00* (2006.01)
*B81B 3/00* (2006.01)
*B81C 1/00* (2006.01)

(52) U.S. Cl.
CPC ........ *B81B 3/0072* (2013.01); *B81C 1/00269* (2013.01); *B81B 2203/0118* (2013.01); *B81C 2203/0118* (2013.01); *B81C 2203/038* (2013.01)

(58) Field of Classification Search
CPC .......................... B81B 3/0072; B81C 1/00269
USPC .......................................................... 438/51
See application file for complete search history.

(56) References Cited

U.S. PATENT DOCUMENTS

| | | | |
|---|---|---|---|
| 3,604,082 A * | 9/1971 | McBrayer | H01G 4/30 156/89.17 |
| 6,521,477 B1 | 2/2003 | Gooch et al. | |
| 2002/0000650 A1* | 1/2002 | Smith | H01L 23/49811 257/692 |
| 2008/0164606 A1 | 7/2008 | Greisen et al. | |
| 2012/0061776 A1* | 3/2012 | Cheng | B81C 1/00333 257/415 |
| 2012/0074590 A1* | 3/2012 | Lin | B81C 1/00269 257/777 |
| 2013/0277777 A1* | 10/2013 | Chang | B81B 7/00 257/418 |
| 2013/0299924 A1* | 11/2013 | Weber | B81B 3/0021 257/415 |
| 2013/0299928 A1* | 11/2013 | Classen | B81B 3/0075 257/417 |
| 2014/0054798 A1* | 2/2014 | Bowles | H01L 23/49811 257/777 |

(Continued)

*Primary Examiner* — Moazzam Hossain

(57) ABSTRACT

A multi-wafer structure is formed by forming a cavity in a cap wafer and forming a first seal material around the cavity. A collapsible standoff structure is formed around the cavity. A movable mass is formed in a device wafer. A second seal material is formed around the movable mass. The first seal material and the second seal material are of materials that are able to form a eutectic bond at a eutectic temperature. The cap wafer and the device wafer are arranged so that the first and second seals are aligned but separated by the collapsible standoff structure. Gas is evacuated from the cavity at a temperature above the eutectic temperature using a low pressure. The temperature is lowered, the cap and device wafer are pressed together, and the temperature is raised above the eutectic temperature to form a eutectic bond with the first and second seal materials.

15 Claims, 11 Drawing Sheets

(56) References Cited

U.S. PATENT DOCUMENTS

| | | | |
|---|---|---|---|
| 2014/0124899 A1 | 5/2014 | Gooch et al. | |
| 2014/0145244 A1* | 5/2014 | Daneman | B81C 3/001 257/254 |
| 2014/0319631 A1* | 10/2014 | Chu | B81B 7/02 257/417 |
| 2015/0360936 A1* | 12/2015 | Tayebi | B81C 1/0023 257/369 |
| 2016/0075554 A1* | 3/2016 | Huang | B81C 1/00285 257/417 |
| 2016/0221824 A1* | 8/2016 | Alper | B81C 1/00301 438/51 |

\* cited by examiner

BONDED WAFER STRUCTURE HAVING CAVITIES WITH LOW PRESSURE AND METHOD FOR FORMING

BACKGROUND

Field

This disclosure relates generally to semiconductor processing, and more specifically, to a bonded wafer structure having cavities with low pressure.

Related Art

During wafer bonding, two wafers are typically stacked and aligned prior to bonding the wafer pair. In order to efficiently outgas the wafers, the wafers are separated by removable spacers, such as with metal tabs which are part of the wafer handling equipment (e.g. pivoting metal tabs of a wafer chuck). After the outgassing, the wafers are brought together during wafer bond in which the removable spacers are removed. However, the wafers frequently slip or move when the removable spacers are removed, thus compromising the alignment of wafers. This is especially problematic when bonding seals on each wafer must be aligned to create appropriate vacuum or low pressure cavities, such as for micro-electro-mechanical system (MEMS) devices. If the wafers slip and misalign during removal of the removable spacers, the appropriate low level of pressure cannot be maintained in the cavities which may result in reduced device performance or reduced device longevity. Therefore, a need exists for improved wafer bonding which allows for wafer separation during outgassing without resulting in misalignment during bonding.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A wafer pair to be bonded to form a bonded wafer structure includes a cap wafer and a device wafer. The cap wafer includes a plurality of cavities, each surrounded by a first seal material, and the device wafer includes a plurality of devices, each surrounded by a second seal material. The first and second seal materials are materials that are capable of forming a eutectic bond at a eutectic temperature. The cap and device wafers are stacked and aligned using collapsible standoff structures such that the first seal material around each cavity aligns with the second seal material around a corresponding device. While stacked with the collapsible standoff structures in a bond chamber, outgassing is performed at a temperature above the eutectic temperature to sufficiently remove trapped gasses from the wafer pair and establish a low pressure in the bond chamber. The temperature is then reduced to below the eutectic temperature, while the stacked wafer pair remains separated by the collapsible structures. A force is then applied to bring the cap and device wafer into contact by collapsing the collapsible structures. This results in the first seal material and the second seal material of the cap wafer and device wafer, respectively, coming into contact. The temperature in the bond chamber is then ramped to the eutectic temperature such that the first and second seal materials form a eutectic bond. In this manner, a eutectic bond surrounds each cavity/device pair of the bonded wafers, thus sealing each device in a cavity with low pressure. Note that since the collapsible standoff structures are not removed but are simply collapsed when force is applied to bring the cap and device wafer into contact, the cap and device wafers do not slip and misalign during the bonding process. With the effective formation of a cavity with low pressure for each device, longevity and performance of each device may be improved.

Figure 1:
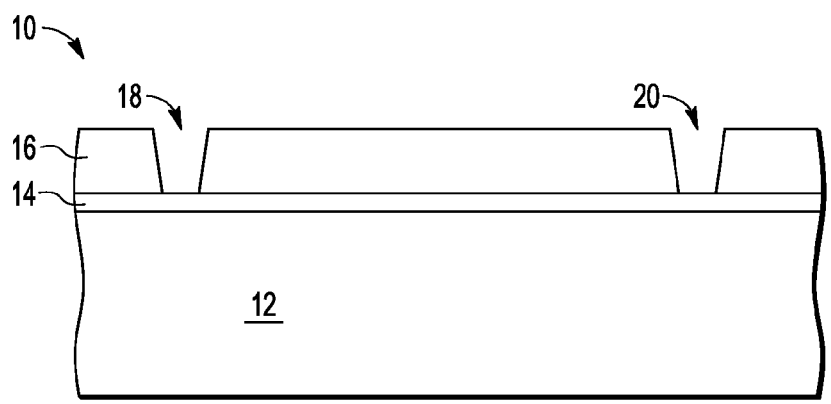
FIGS. 1-10 illustrate, in cross sectional form, a wafer pair at various stages of processing in accordance with one embodiment of the present invention.

FIG. 1 illustrates, in cross sectional form, a portion of a cap wafer 10 in accordance with one embodiment of the present invention. Cap wafer 10 includes a substrate 12, a seal layer 14 over substrate 12, and an insulating layer 16 over seal layer 14. Openings 18 and 20 are formed in insulating layer 16. Substrate 12 can be any semiconductor material or combinations of materials, such as gallium arsenide, silicon germanium, silicon-on-insulator (SOI), silicon, monocrystalline silicon, the like, and combinations of the above. In one embodiment, insulating layer 16 is an oxide layer and may be formed using tetraethylorthosilicate (TEOS). In FIG. 1, the illustrated portion of cap wafer 10 corresponds to one cavity location of cap wafer 10. Each cavity location of cap wafer 10 corresponds to a die location of a device wafer which will be bonded with cap wafer 10, and which will be described in further detail below. Note that openings similar to openings 18 and 20 can be formed for every cavity location of cap wafer 10. Seal layer 14 includes a first seal material, such as, for example, germanium.

Figure 2:
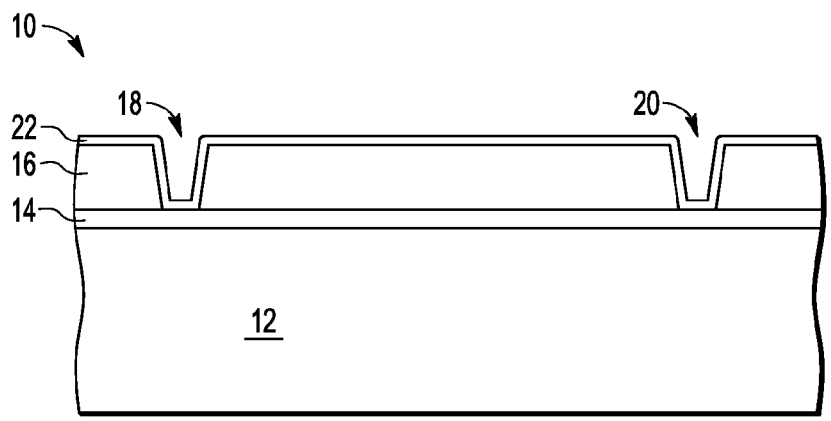

FIG. 2 illustrates, in cross sectional form, cap wafer 10 at a subsequent stage in processing in which a polysilicon layer 22 is formed over insulating layer 16, and within openings 18 and 20. In one embodiment, polysilicon layer 22 is thinner than insulating layer 16, and does not fill openings 18 and 20.

Figure 3:
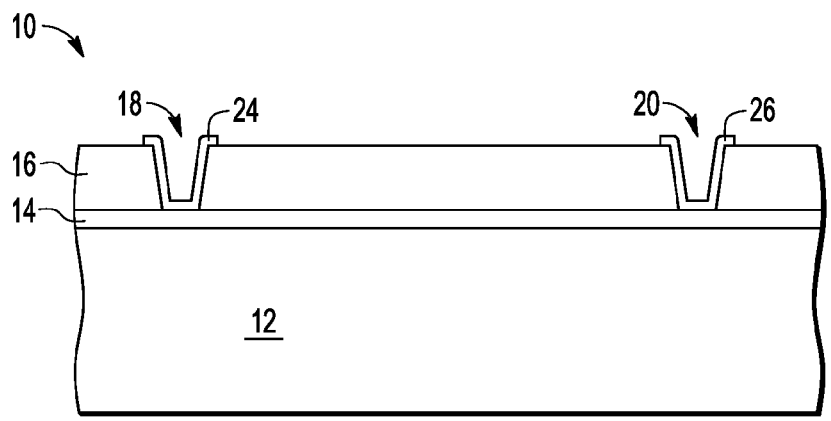

FIG. 3 illustrates, in cross sectional form, cap wafer 10 at a subsequent stage in processing. Polysilicon layer 22 is patterned to remove portions of polysilicon layer 22 between the openings in insulating layer 16. Portions of layer 22 remaining in the openings form collapsible standoff structures. Therefore, collapsible standoff structure 24, formed from layer 22, remains in opening 18 and collapsible standoff structure 26, formed from layer 22, remains in opening 20. Each collapsible standoff structure is in contact with underlying seal layer 14.

Figure 4:
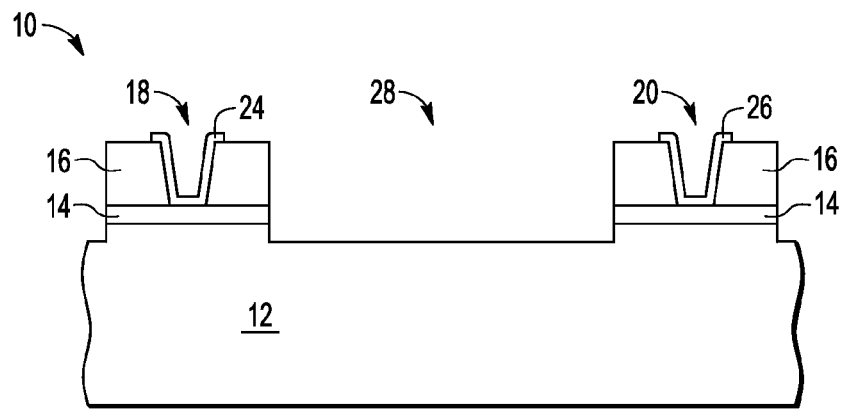

FIG. 4 illustrates, in cross section form, cap wafer 10 at a subsequent stage in processing. An opening 28 is formed between openings 18 and 20. Opening 28 extends through insulating layer 16 and seal layer 14, and extends into substrate 12. An opening, such as opening 28, is formed to overlie locations on the device wafers where a low pressure cavity, e.g. vacuum, is desired. In this manner, as illustrated in FIG. 4, a remaining portion of seal layer 14 forms a seal ring around opening 28.

Figure 5:
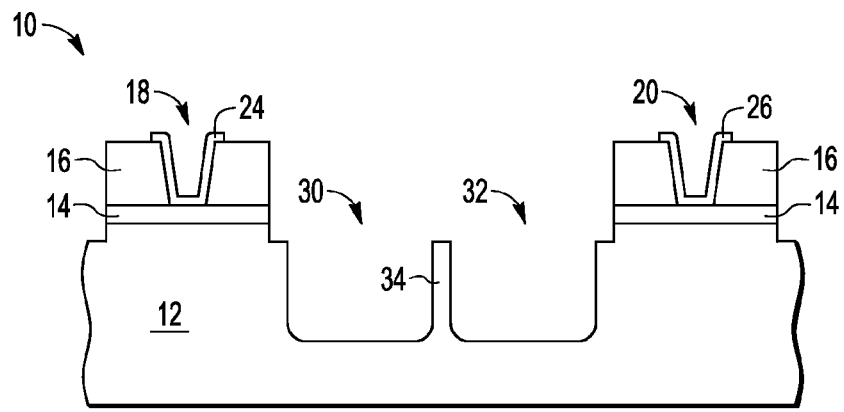

FIG. 5 illustrates, in cross section form, cap wafer 10 at a subsequent stage in processing in which cavities are formed within the openings, such as opening 28. Therefore, a cavity 30 and a cavity 32 are formed within opening 28 which extend deeper into substrate 12. A remaining portion of substrate 12 between cavities 30 and 32 corresponds to an over-travel stop 34 of a MEMS device, as will be described in more detail below. (Note that opening 28 may be referred to as a cavity, and cavities 30 and 32 may be referred to as sub-cavities.)

Figure 6:
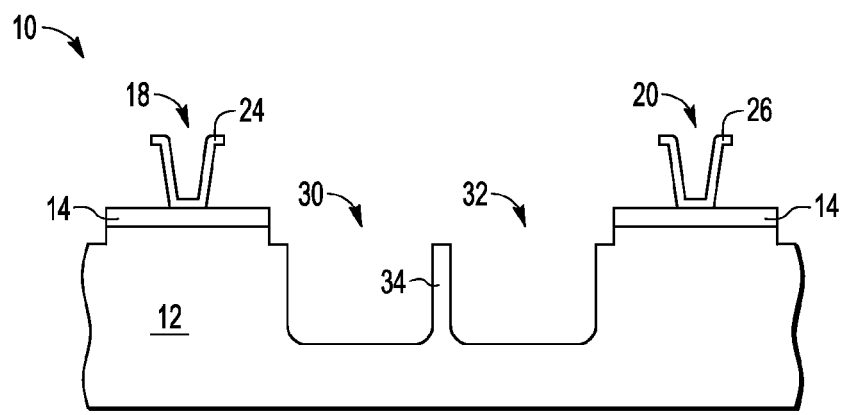

FIG. 6 illustrates, in cross section form, cap wafer 10 at a subsequent stage in processing. Insulating layer 16 is removed from cap wafer 10 resulting in collapsible standoff structures 24 and 26 no longer being supported by an insulating layer. As will be described below, the resulting standoff structures, which are in contact with seal layer 14, are sufficiently strong to not collapse when inverted and stacked upon another wafer. However, they are sufficiently fragile such that with the application of appropriate force, they do collapse.

Figure 7:
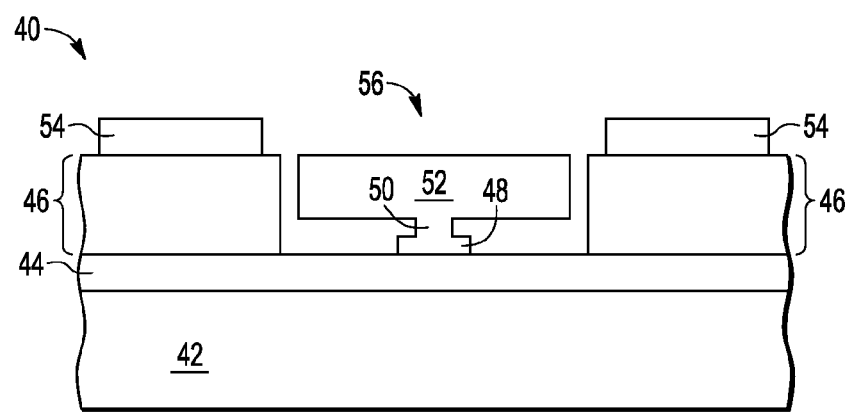

FIG. 7 illustrates, in cross sectional form, a portion of a device wafer 40 in accordance with one embodiment of the present invention. Device wafer 40 includes a plurality of die in which each die includes a device, such as a MEMS device 56. Device wafer 40 includes a substrate 42, a dielectric layer 44 over substrate 42, and a silicon layer 46 having an opening which exposes dielectric layer 44. MEMS device 56 is located within the opening having a routing layer 48 in contact with dielectric layer 44, a spring portion 50 over routing layer 48, and a movable mass 52 over spring portion 50. Each of portions 48, 50, and 52 may be made and patterned as silicon layer 46 is formed. That is, layer 46 may include a number of layers which achieves the resulting thickness of layer 46 and which may be used to form each portion of the MEMS device. MEMS device 56 may be any type of MEMS device such as a resonator, a gyroscope, accelerometer, etc. Therefore, the portions of MEMS device 56 may be formed as needed. In one embodiment, spring 50 may be a pivot or an anchor for movable mass 52. In another embodiment, movable mass 52 may also function as a sense capacitance structure or as an electrical interconnect. A seal ring 54 over polysilicon layer 46 surrounds MEMS device 56. In one embodiment, seal ring 54 is patterned from a seal layer formed over polysilicon layer 46 and includes a second seal material, such as aluminum.

Figure 8:
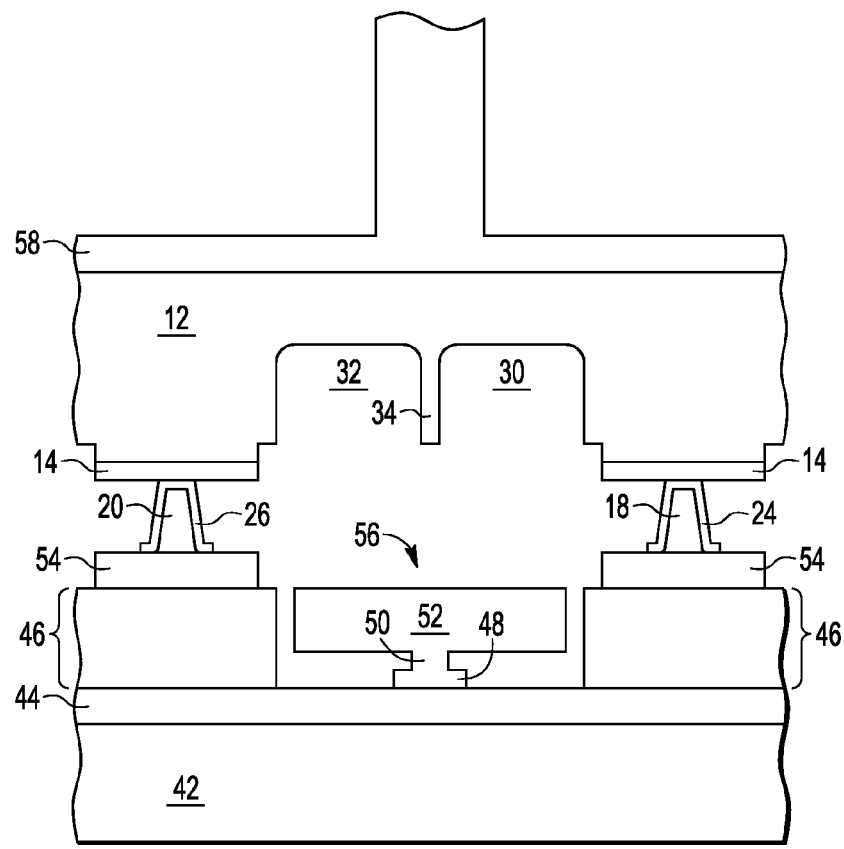
Figure 9:
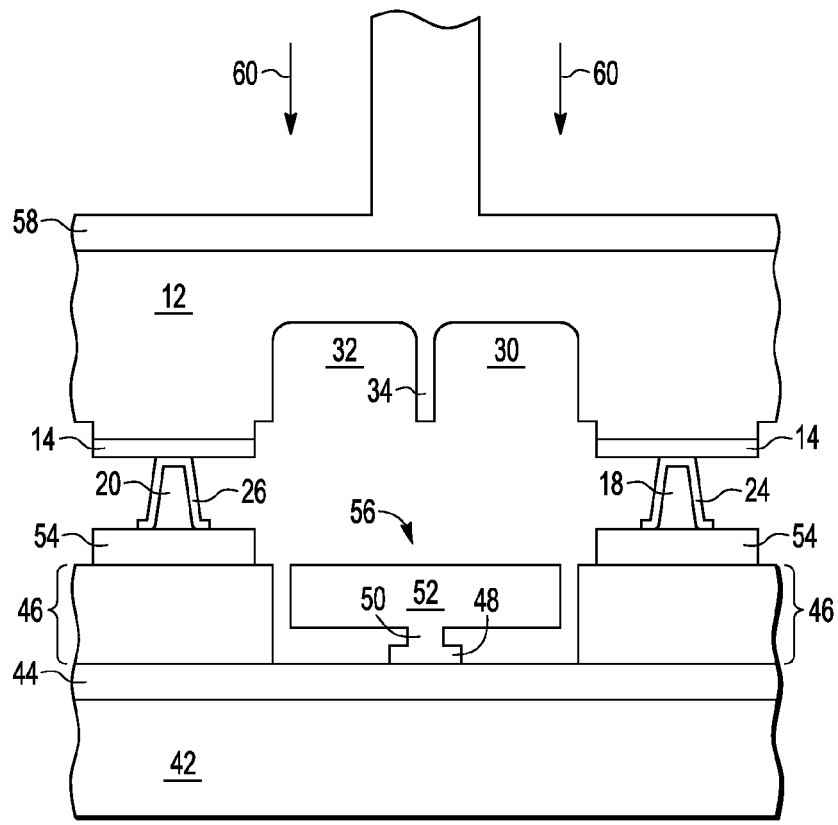
Figure 10:
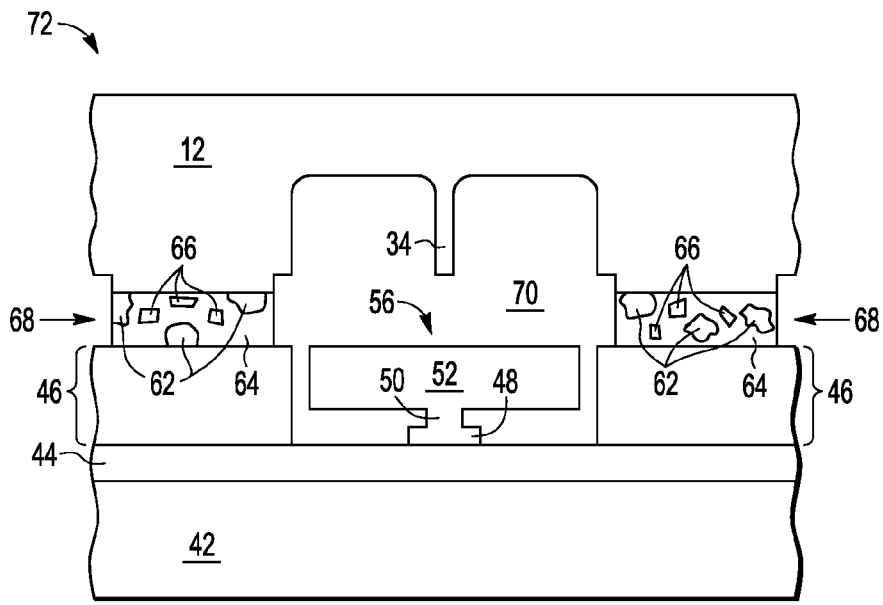
Figure 11:
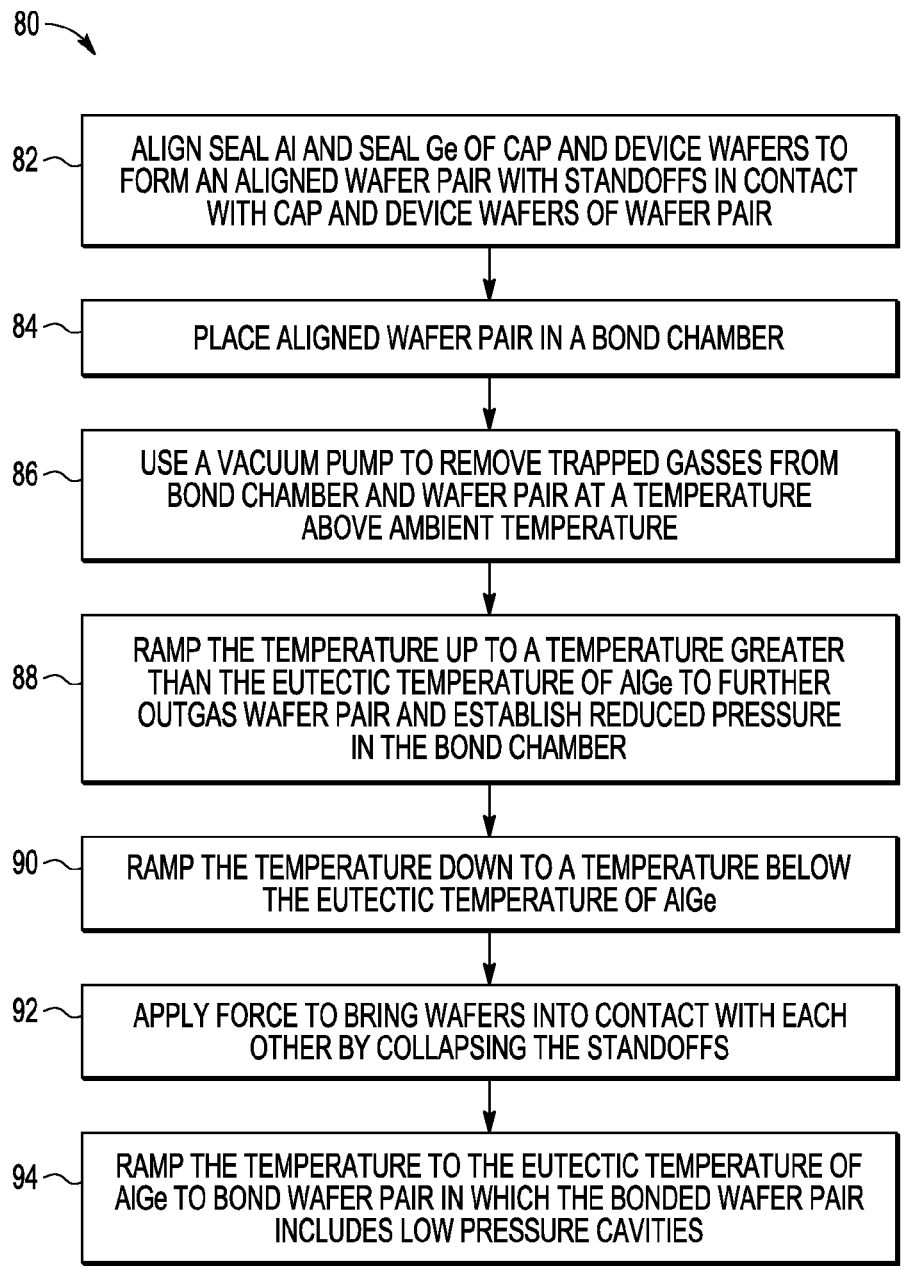
FIG. 11 illustrates, in flow diagram form, a method for forming a bonded wafer structure in accordance with one embodiment of the present invention.

FIGS. 8-10 will be described in further detail in combination with method 80 illustrated in flow diagram form in FIG. 11. In FIG. 11, method 80 begins with block 82 in which the seal aluminum and the seal germanium of the cap and device wafers, respectively, are aligned to form an aligned wafer pair with standoffs in contact with the cap and device wafers of the wafer pair. Referring to FIG. 8, FIG. 8 illustrates, in cross sectional form, cap wafer 10 (from FIG. 6) inverted and stacked onto device wafer 40. Cap wafer 10 and device wafer 40 are aligned such that cavities 30 and 32 are aligned over device 56 and seal ring 14 (which may be referred to as the seal germanium) is aligned over seal ring 54 (which may be referred to as the seal aluminum). In one embodiment, wafers 40 and 10 are first stacked and subsequently aligned. Collapsible standoff structures 26 and 24 contact both seal ring 14 of cap wafer 10 and seal ring 54 of device wafer 40 and support cap wafer 10 on top of device wafer 40. Collapsible standoff structures ensure that cap wafer 10 and device wafer 40 remain spaced apart by a distance equivalent to the height of the standoff structures. They do not collapse under the weight of one wafer stacked on top. The aligned wafer pair is then placed into a bond chamber, as indicated in block 84 of method 80 in FIG. 11. Note that cap wafer 10 is in contact with a down force mechanism 58, but no down force is yet applied. Although, as illustrated, cap wafer 10 is represented as being in contact with down force mechanism 58, the positions of device wafer 40 and cap wafer 10 may be reversed such that device wafer 40 is in contact with down force mechanism 58 instead.

Once in the bond chamber, method 80 continues to block 86 in which a vacuum pump is used to remove trapped gasses from the bond chamber and the wafer pair at a temperature that is above ambient temperature. This commences the outgassing of trapped gasses from the wafer pair. Method 80 continues to block 88 in which the temperature in the bond chamber is ramped to a temperature that is greater than the eutectic temperature of AlGe to further outgas the wafer pair and to establish reduced pressure in the bond chamber. By performing the outgassing at a high temperature (greater than the eutectic temperature of the combination of the two seal ring materials), improved outgassing is achieved resulting in an improved low pressure environment within the bond chamber. Standoff structures 26 and 24 prevent seal rings 14 and 54 from prematurely bonding prior to completing the outgassing. Since the outgassing temperature is at a temperature greater than the eutectic temperature, seal rings 14 and 54 need to remain spaced apart during outgassing. Note that the outgassing evacuates gas from cavities 32, 30, and in the materials surrounding MEMS device 56 in preparation for creating a low pressure cavity for MEMS device 56.

Referring still to FIG. 11, method 80 continues to block 90 in which the temperature is ramped back down to a temperature that is below the eutectic temperature of AlGe. Once the temperature is below the eutectic temperature, method 80 proceeds to block 92 in which a force is applied to bring the cap and device wafers into contact with each other by collapsing the standoff structures.

FIG. 9 illustrates, in cross sectional form, application of a down force 60 using down force mechanism 58 which results in collapsing standoff structures 26 and 24. Therefore, cap wafer 10 and device wafer 40 are pressed together with sufficient force to bring seal ring 14 into contact with seal ring 54. Method 80 of FIG. 11 then proceeds to block 94 in which the temperature is ramped to the eutectic temperature of AlGe to bond the wafer pair in which the bonded wafer pair includes low pressure cavities.

FIG. 10 illustrates, in cross section form, the result of bringing cap wafer 10 into contact with device wafer 40 and raising the temperature to the eutectic temperature of AlGe such that seal ring 14 and seal ring 54 form a eutectic bond, resulting in a eutectic seal 68. Eutectic seal 68 surrounds a cavity which is formed by cavities 30 and 32 and the spaces around MEMS device 56. Note also that travel stop 34 can operate as a travel stop for moveable mass 52. Since eutectic seal 68 was formed in the bond chamber having reduced pressure, cavity 70 has low pressure. For example, cavity 70 may be a vacuum.

In the formation of eutectic seal 68 in which the seal material of seal ring 14 is germanium and the seal material of seal ring 54 is aluminum, eutectic seal 68 results in having germanium portions 62 and aluminum portions 64. Above the eutectic temperature, the sealing alloy of the two seal materials is liquid so a good quality seal with no empty spaces (i.e. voids) is formed. Portions of the collapsible structure are surrounded by the alloyed materials during this process. The resulting eutectic material and ratios of Al and Ge may be controlled by the thicknesses of seal ring 14 and seal ring 54. Also, while the examples of FIGS. 1-11 have been described in reference to aluminum and germanium as the two seal materials bonded together, other materials may be used as the seal ring on the device wafer and seal ring on the cap wafer to form different eutectic and non-eutectic bonds, other than eutectic AlGe. Therefore, eutectic seal 68 may also be referred to as a sealing alloy ring. Also, due to the collapse of collapsible standoff structures 24 and 26, eutectic seal 68 may include polysilicon fragments 66 which broke off from the collapsible standoffs structures. Polysilicon fragments 66 may therefore be referred to as a collapsed standoff structure which is located within eutectic seal 68. The design of collapsible standoff structures 24 and 26 may also be such that deformation during the bonding process does not cause plastic deformation or fracture, but rather elastically deforms the structure into a flat form that then integrates with the newly formed sealing alloy and is frozen in the flat state.

In the embodiments of FIGS. 1-10, note that the standoff structures were formed in the region in which seal rings 14 and 54 are aligned to form sealing alloy ring 68 which surrounds cavity 70. That is, upon stacking the wafers, the standoff structures are between seal rings 14 and 54, in which seal rings 14 and 54 react to become the eutectic seal ring which seals in low pressure cavity 70. Since it is possible that a fragment of a standoff structure upon being collapsed may enter into cavity 70, in an alternate embodiment, the standoff structures may be formed outside of alignment region of the seal rings such as seal rings 14 and 54.

Figure 12:
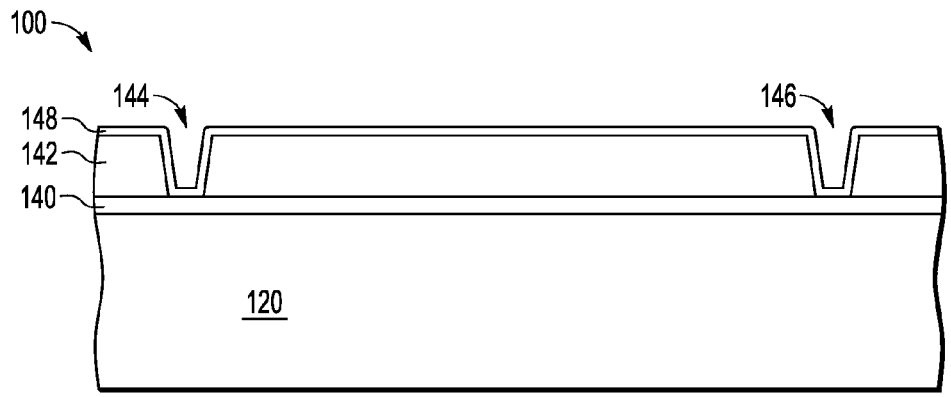
FIGS. 12-18 illustrate, in cross sectional form, a wafer pair at various stages of processing in accordance with one embodiment of the present invention.

FIGS. 12-18 illustrate, in cross section form, formation of a bonded wafer pair with the use of collapsible structures formed outside of the seal rings. FIG. 12 illustrates, in cross sectional form, a portion of a cap wafer 100 in accordance with one embodiment of the present invention. Cap wafer 100 includes a substrate 120, a seal layer 140 over substrate 120, and an insulating layer 142 over seal layer 140. Openings 144 and 146 are formed in insulating layer 142. A layer 148 is formed over insulating layer 142, and within openings 144 and 146. In one embodiment, layer 148 is thinner than insulating layer 142 and does not fill openings 144 and 146. Substrate 120 can be any semiconductor material or combinations of materials, such as gallium arsenide, silicon germanium, silicon-on-insulator (SOI), silicon, monocrystalline silicon, the like, and combinations of the above. In one embodiment, insulating layer 142 is an oxide layer and may be formed using tetraethylorthosilicate (TEOS). In FIG. 12, the illustrated portion of cap wafer 100 corresponds to one cavity location of cap wafer 100. Each cavity location of cap wafer 100 corresponds to a die location of a device wafer which will be bonded with cap wafer 100, and which will be described in further detail below. Note that openings similar to openings 144 and 146 can be formed for every cavity location of cap wafer 10. Seal layer 140 includes a first seal material, such as, for example, germanium or aluminum. Layer 148 may be a polysilicon layer or may be of a different material, such as aluminum. For example, in the case that seal layer 140 is germanium, layer 148 may be a polysilicon layer, and in the case that seal layer 140 is aluminum, layer 148 may be an aluminum layer.

Figure 13:
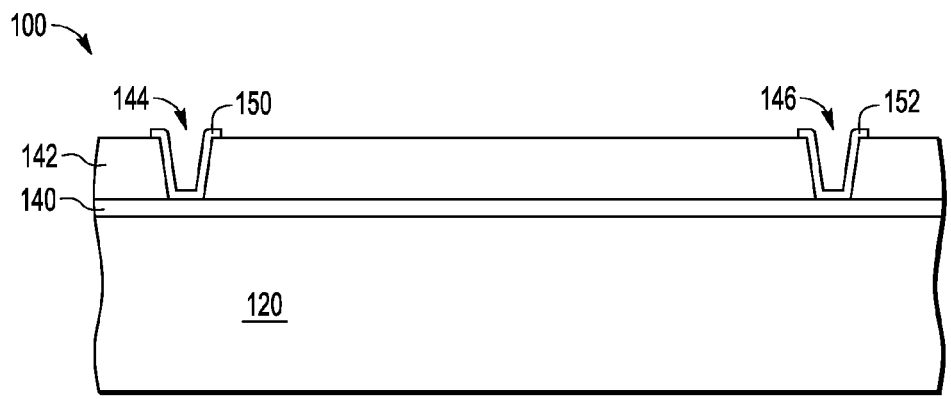

FIG. 13 illustrates, in cross sectional form, cap wafer 100 at a subsequent stage in processing. Layer 148 is patterned to remove portions of layer 148 between the openings in insulating layer 142. Portions of layer 148 remaining in the openings form collapsible standoff structures. Therefore, collapsible standoff structure 150, formed from layer 148, remains in opening 144 and collapsible standoff structure 152, formed from layer 148, remains in opening 146. Each collapsible standoff structure is in contact with underlying seal layer 140. Depending on seal material of seal layer 140, collapsible standoff structures 150 and 152 may either be polysilicon or aluminum.

Figure 14:
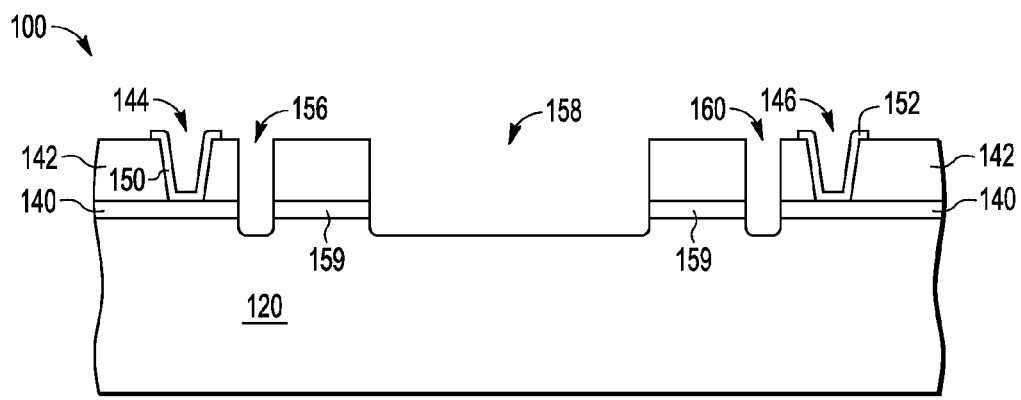

FIG. 14 illustrates, in cross section form, cap wafer 100 at a subsequent stage in processing. Openings 156, 158, and 160 are formed in insulating layer 142, and they each extend through insulating layer 142 and seal layer 140, and into substrate 120. Opening 158 is formed between openings 144 and 146, opening 156 is formed between opening 144 and 158, and opening 160 is formed between opening 158 and 146. These openings define a portion 159 of seal layer 140 which surrounds cavity 158, and may therefore be referred to as seal ring 159. As will be described below, seal ring 159 will form the eutectic seal ring which encloses the final low pressure cavity containing the MEMS device. Note that collapsible standoff structures 150 and 152 are spaced apart from seal ring 159 by openings 156 and 160. Openings such as openings 156, 158, and 160 are formed in each die location of cap wafer 100.

Figure 15:
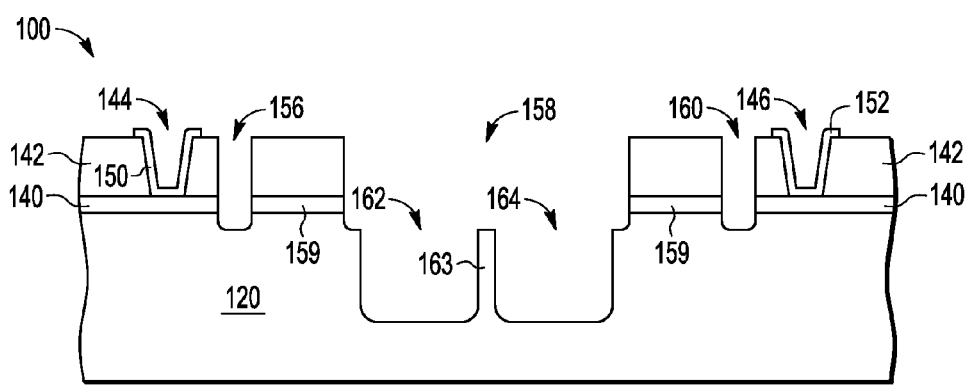

FIG. 15 illustrates, in cross section form, cap wafer 100 at a subsequent stage in processing in which cavities are formed within opening 158. Therefore, a cavity 162 and a cavity 164 are formed within opening 158 which extend deeper into substrate 120 than openings 156, 158, and 160. A remaining portion of substrate 120 between cavities 162 and 164 correspond to a travel stop 163 of a MEMS device, as will be described in more detail below.

Figure 16:
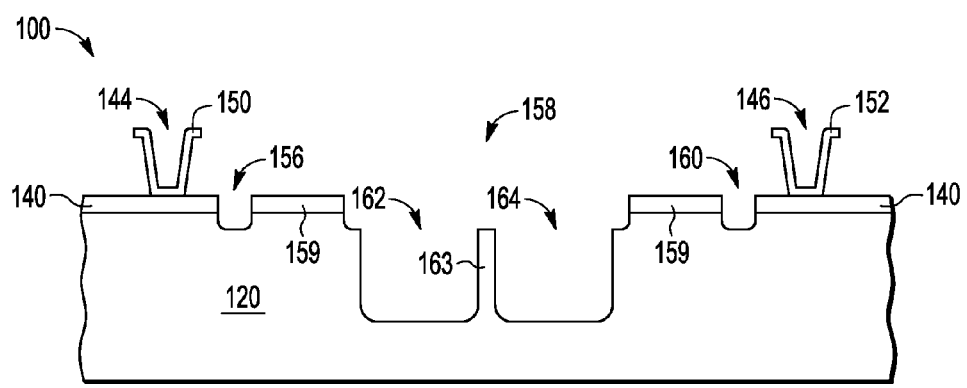

FIG. 16 illustrates, in cross section form, cap wafer 100 at a subsequent stage in processing. Insulating layer 142 is removed from cap wafer 100 resulting in collapsible standoff structures 150 and 152 no longer being supported by an insulating layer. As with collapsible standoff structures 24 and 26, resulting standoff structures 150 and 152 are sufficiently strong to not collapse when inverted and stacked upon another wafer. However, they are sufficiently fragile such that with the application of appropriate force, they do collapse.

Figure 17:
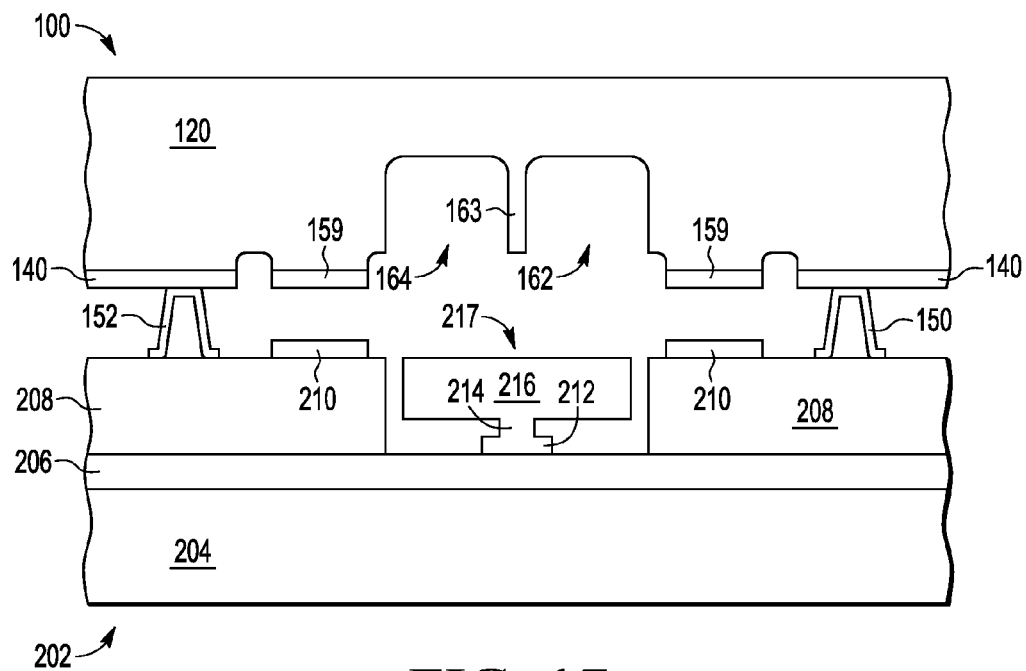

FIG. 17 illustrates, in cross sectional form, cap wafer 100 placed over a portion of a device wafer 200 in accordance with one embodiment of the present invention. Device wafer 200 includes a plurality of die in which each die includes a device, such as a MEMS device 217. Device wafer 200 includes a substrate 204, a dielectric layer 206 over substrate 204, and a silicon layer 208 having an opening which exposes dielectric layer 206. MEMS device 217 is located within the opening having a routing layer 212 in contact with dielectric layer 206, a spring portion 214 over routing layer 212, and a movable mass 216 over spring portion 214. Note that the descriptions of substrate 204, dielectric layer 206, silicon layer 208, MEMS device 217, routing layer 212, spring portion 214, and movable mass 216 are analogous to the descriptions of substrate 42, dielectric layer 44, silicon layer 46, MEMS device 56, routing layer 48, and a spring portion 50, respectively, of device wafer 40 described above. A seal ring 210 over polysilicon layer 208 surrounds MEMS device 217. In one embodiment, seal ring 210 is patterned from a seal layer formed over polysilicon layer 208 and includes a second seal material. This second seal material is a seal material which is capable of forming a eutectic bond with the first seal material of seal ring 159. Therefore, if seal ring 159 is germanium, the second seal material may be aluminum, and if seal ring 159 is aluminum, the second seal material may be germanium.

As illustrated in FIG. 17, cap wafer 100 and device wafer 200 are aligned to form an aligned wafer pair with standoffs in contact with the cap and device wafers of the wafer pair. Cap wafer 100 is inverted and stacked onto device wafer 200. Cap wafer 100 and device wafer 200 are aligned such that cavities 164 and 162 are aligned over device 217 and seal ring 159 is aligned over seal ring 210. In one embodiment, wafers 200 and 100 are first stacked and subsequently aligned. Collapsible standoff structures 152 and 150 contact polysilicon layer 208 of device wafer 200 and a remaining portion of seal layer 140 of cap wafer 100. Collapsible standoff structures 152 and 150 are spaced apart from seal rings 159 and 210 and thus are outside a region where seal rings 159 and 310 are aligned. Collapsible standoff structures 152 and 150 ensure that cap wafer 100 and device wafer 200 remain spaced apart by a distance equivalent to the height of the standoff structures. They do not collapse under the weight of one wafer stacked on top. The aligned wafer pair is then placed into a bond chamber. Note that the temperatures described above in method 80 of FIG. 11 also apply to the wafer pair of FIGS. 17 and 18.

Once in the bond chamber, a vacuum pump is used to remove trapped gasses from the bond chamber and the wafer pair at a temperature that is above ambient temperature. This commences the outgassing of trapped gasses from the wafer pair. The temperature in the bond chamber is then ramped to a temperature that is greater than the eutectic temperature of AlGe to further outgas the wafer pair and to establish reduced pressure in the bond chamber. By performing the outgassing at a high temperature (greater than the eutectic temperature of the combination of the two seal ring materials), improved outgassing is achieved resulting in an improved low pressure environment within the bond chamber. Standoff structures 152 and 150 prevent seal rings 159 and 210 from prematurely bonding prior to completing the outgassing. Since the outgassing temperature is at a temperature greater than the eutectic temperature, seal rings 159 and 210 need to remain spaced apart during outgassing. Note that the outgassing evacuates gas from cavities 164 and 162 in preparation for creating a low pressure cavity for MEMS device 217.

After a sufficient amount of time for the outgassing, the temperature is ramped back down to a temperature that is below the eutectic temperature of AlGe. Once the temperature is below the eutectic temperature, a force is applied to bring the cap and device wafers into contact with each other by collapsing the standoff structures. If the collapsible standoff structures are polysilicon, they will be collapsed into fragments, as describe above in reference to standoff structures 24 and 26. If the collapsible standoff structures are aluminum, they would be bent and deformed, allowing the wafers to be brought together. By collapsing standoff structures 152 and 150 collapsing with the application of a down force, seal ring 159 is brought into contact with seal ring 210. Once the seal rings are brought into contact, the temperature is ramped to the eutectic temperature of AlGe to bond the wafer pair in which the bonded wafer pair includes low pressure cavities.

Figure 18:
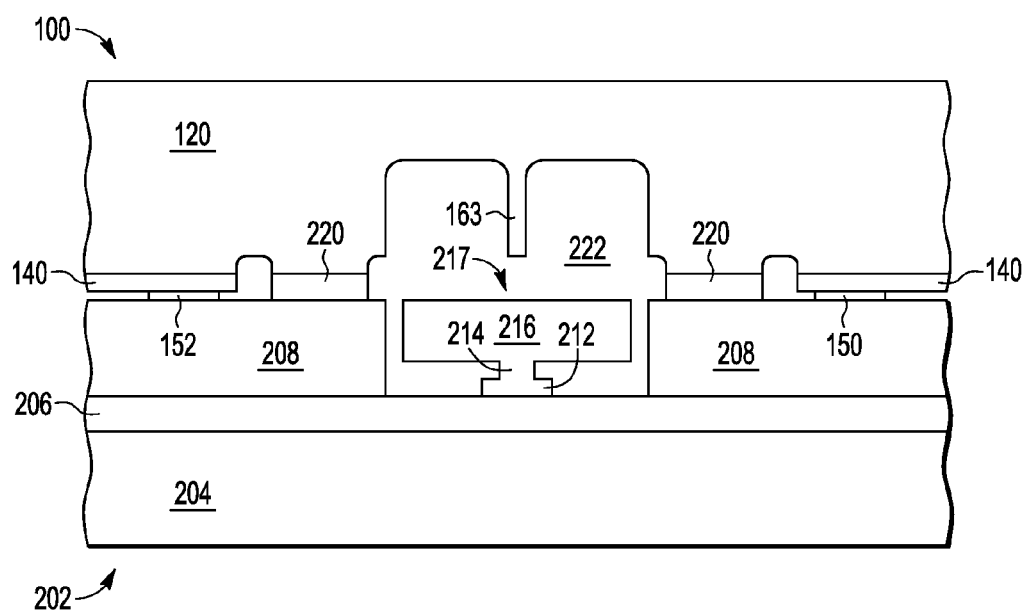

FIG. 18 illustrates, in cross section form, the result of bringing cap wafer 100 into contact with device wafer 200 and raising the temperature to the eutectic temperature of AlGe such that seal ring 159 and seal ring 210 form a eutectic bond, resulting in a eutectic seal 220. Eutectic seal 220 surrounds a cavity 222 which is formed by cavities 162 and 164 and the spaces around MEMS device 217. Note also that travel stop 163 can operate as a travel stop for moveable mass 216. Since eutectic seal 220 was formed in the bond chamber having reduced pressure, cavity 222 has low pressure. For example, cavity 222 may be a vacuum. FIG. 18 illustrates the example in which collapsible standoff structures 152 and 150 are aluminum and get deformed between seal layer 140 and polysilicon layer 208. In the example in which collapsible standoff structures 152 and 150 are polysilicon, a portion of the standoff structures may remain between seal layer 140 and polysilicon layer 208 and fragments may also remain present. However, these fragments would not be located within eutectic seal 220 nor would they be able to enter cavity 222. Regardless of the material used for the standoff structures, due to their location with respect to eutectic bond 220, eutectic bond 220 would be substantially free from portions of collapsible standoff structures 152 and 150.

As with eutectic seal 68, the resulting eutectic material and ratios of Al and Ge may be controlled by the thicknesses of seal ring 159 and seal ring 210. Also, while the examples of FIGS. 12-18 have been described in reference to aluminum and germanium as the two seal materials bonded together, other materials may be used as the seal ring on the device wafer and seal ring on the cap wafer to form different eutectic bonds, other than eutectic AlGe.

With MEMS devices 56 and 217 being in a low pressure cavity, the performance and longevity of the devices may be improved as compared to devices in which a low pressure cavity is not properly formed. For example, not outgassing at a temperature that is greater than the eutectic temperature prior to wafer bonding or a misalignment of seal rings 14 and 54 or seal rings 159 and 210 upon raising the temperature to the eutectic temperature for bonding may result in an increased pressure within cavities 70 and 222 which would adversely affect performance and longevity of the MEMS devices. Therefore, the ability for the standoff structures, such as standoff structures 24 and 26 or standoff structures 150 and 152, to withstand a temperature greater than the eutectic temperature of the materials of the aligned seal rings allows the wafer pair to maintain separation for improved outgassing at the greater temperature. The temperature can be then be lowered again to below the eutectic temperature to allow the wafers to come into contact at the lower temperature prior to forming the eutectic bond. Furthermore, by collapsing under the force of the down pressure mechanism prior to raising the temperature to the eutectic temperature, the collapsible standoff structures allow for the alignment between seal rings 14 and 54 or between seal rings 159 and 210 to be maintained. That is, since the collapsible standoff structures collapse and need not be removed, there is minimal risk of slipping or misalignment between the wafer pair. The improved alignment of the two wafers used to form the hermetic MEMS structure may also allow for improved electrical connections in the case where the cap wafer also includes electrical connections to the device wafer.

Figure 19:
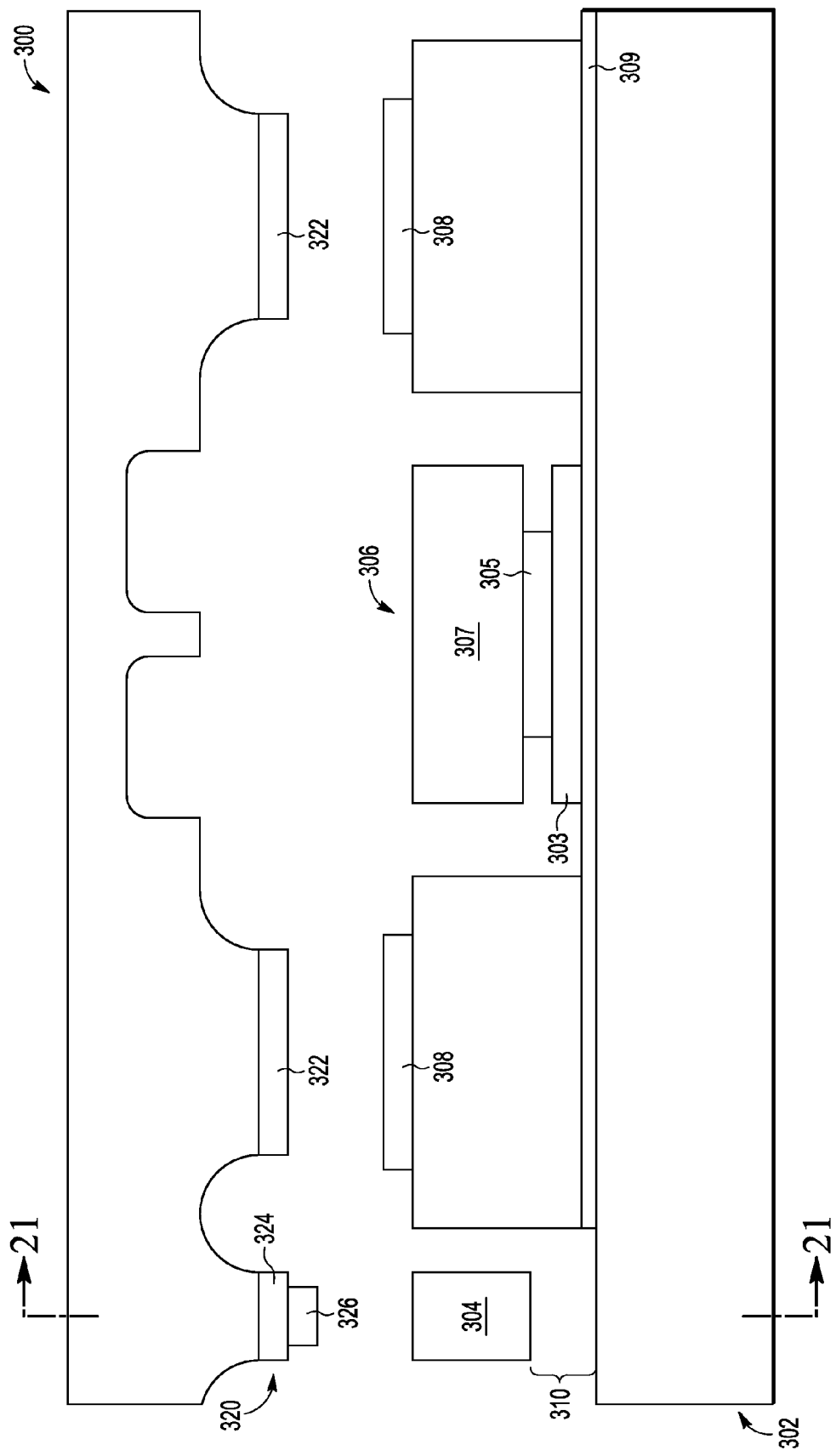
FIGS. 19-22 illustrates, in cross sectional form, a wafer pair at various stages of processing in accordance with one embodiment of the present invention.

FIGS. 19-22 illustrate in cross section form, formation of a bonded wafer pair with the use of a collapsible structure formed by a post and cantilever aligned with each other. In one embodiment, the post is formed on the cap wafer and the cantilever is formed on the device wafer. FIG. 19 illustrates a wafer pair including a cap wafer 300 and a device wafer 302. Cap wafer 300 may be formed in a similar fashion to cap wafers 10 and 100. For example, cap wafer 300 includes a seal layer 320 formed over a substrate in which openings are formed to define a seal layer portion 324 and a seal ring 322. These openings are similar to openings 156, 158, and 160. Further, additional openings may be formed to form cavities separate by a travel stop within the opening inside seal ring 322, similar to cavities 30 and 32 or cavities 162 and 164. A polysilicon bond post 326 is formed over seal layer portion 324. Polysilicon bond post 326 may be formed by depositing and patterning a polysilicon layer over seal layer 320. In FIG. 19, cap wafer 300 is inverted and aligned over device wafer 302. Device wafer 302 is similar to devices wafers 40 and 202 described above. For example, device wafer 302 includes a dielectric layer 309 over a substrate, a MEMS device 306 within an opening in a polysilicon layer, and a seal ring 308 formed over the polysilicon layer and around MEMS device 306. MEMS device 306 includes a routing layer 303, a spring portion 305 (which may be a pivot or anchor), and a movable mass 307. These may be similar to dielectric layer 206 or 44, MEMS devices 56 or 217, and seal ring 54 or 210, respectively, which have been described above. Device wafer 302 also includes a cantilever 304 outside of seal ring 308. Cantilever 304 is at a distance 310 above the substrate of device wafer 302.

Figure 21:
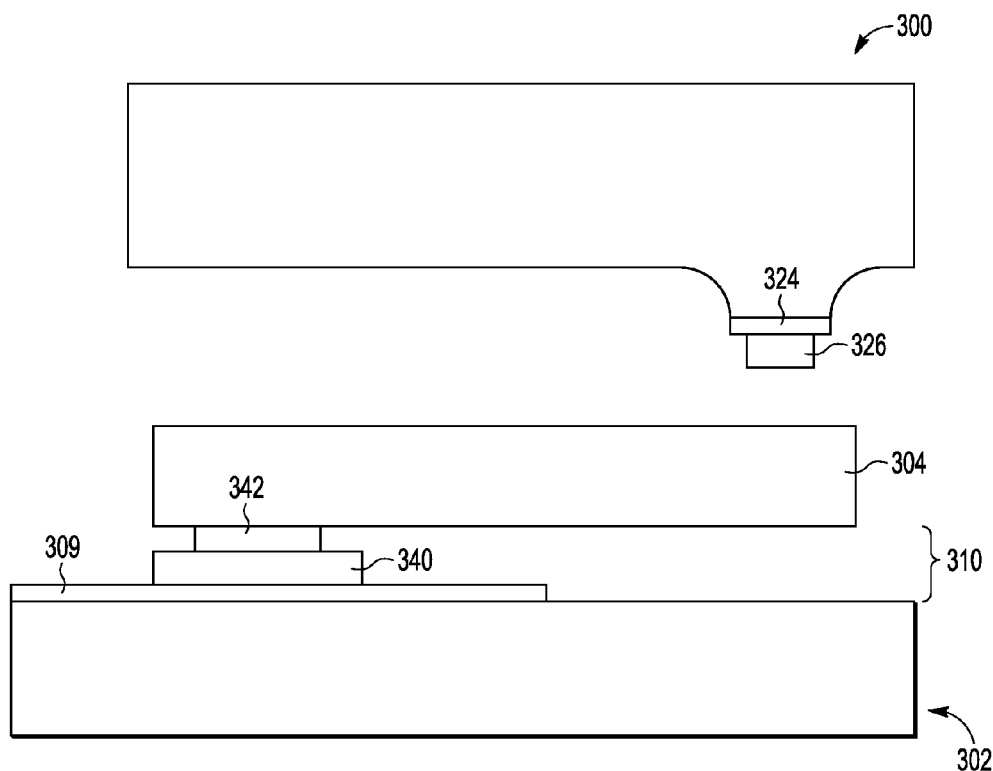

As illustrated in FIG. 19, cap wafer 300 is inverted and aligned over device wafer 302 such that bond post 326 is aligned with cantilever 304 and seal ring 322 is aligned with seal ring 308. Note that cap wafer 300 and device wafer 302 have not yet been brought into contact. FIG. 21 illustrates a cross section of the wafer pair of FIG. 19 taken from a perspective that is 90 degrees from the perspective of FIG. 19. Therefore, the length of cantilever 304 is visible. Cantilever 304 is supported by a layer 340 and a pivot 342. Cantilever 304, pivot 342, and layer 340 may be formed at the same time as the moveable mass 307, spring portion 305, and routing layer 303 of MEMS device 306. Therefore, they are formed of the same materials as the corresponding portion of MEMS device 306. Also, as with the embodiments described above, seal ring 322 may include a first seal material, and seal ring 308 may includes a second seal material which is capable of forming a eutectic bond with the first seal material. For example, seal ring 322 may be aluminum and seal ring 308 may be germanium, or seal ring 322 may be germanium and seal ring 308 may be aluminum. Alternatively, other seal materials may be used to form a different eutectic bond other than an AlGe eutectic bond.

In a bond chamber, cap wafer 300 is aligned and stacked onto device wafer 302. Upon being stacked, polysilicon post 326 rests upon cantilever 304 and maintains seal ring 322 spaced apart from seal ring 308. The separation distance between the seal rings is determined by the thickness of polysilicon post 326 as measured from seal layer 324. Note that pivot 304 is stiff enough so that it does not allow cantilever 304 to tilt downward with just the weight of the cap wafer on top. That is, distance 310 is maintained, even with cap wafer 300 in contact with device wafer 302. Therefore, the combination of post 326 and cantilever 304 form a collapsible standoff structure which maintain the separation between wafers upon being stacked and aligned in the bond chamber. As described above in the embodiments of FIGS. 1-17, the temperature is raised to a temperature above the eutectic temperature of the aligned seal rings for improved outgassing. While the wafers maintain their separation, the temperature is again lowered to below the eutectic temperature.

Figure 22:
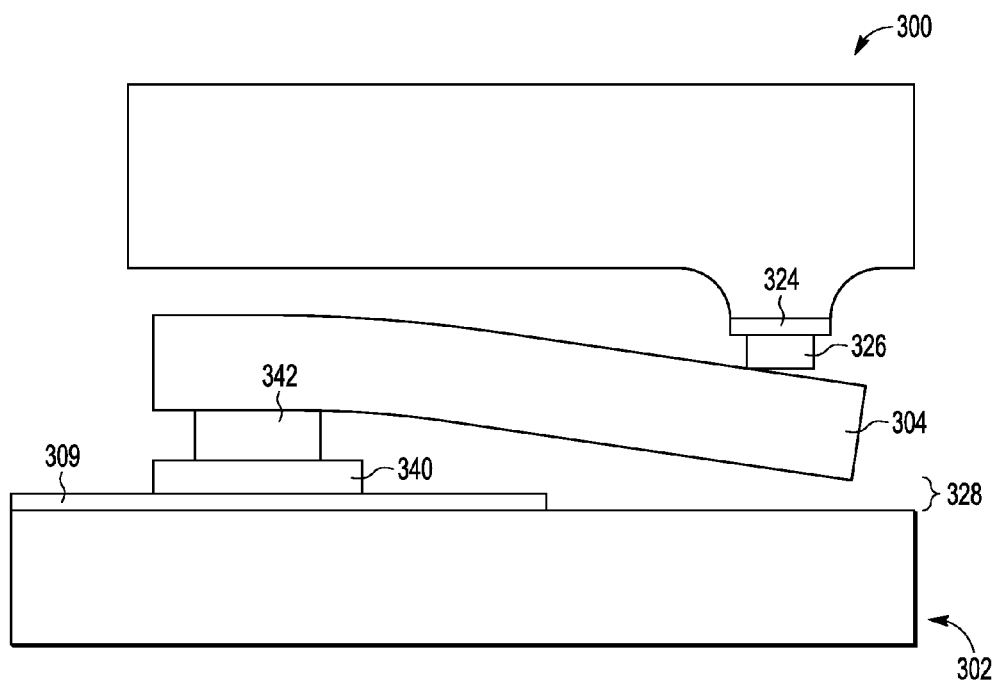

FIG. 22 illustrates a cross sectional view of the wafer pair from the same perspective as FIG. 21 after application of a force to bring seal rings 322 and 308 into physical contact. Under a down force, polysilicon post 326 pushes down upon cantilever 304 with sufficient force to displace cantilever 304 such that distance 310 is reduced to a distance 328 between cantilever 304 and the substrate of device wafer 302. Therefore, by depressing cantilever 304, the aligned seal rings are brought into contact while the temperature is still below the eutectic temperature. Once the seal rings are in contact, the temperature is raised to the eutectic temperature.

Figure 20:
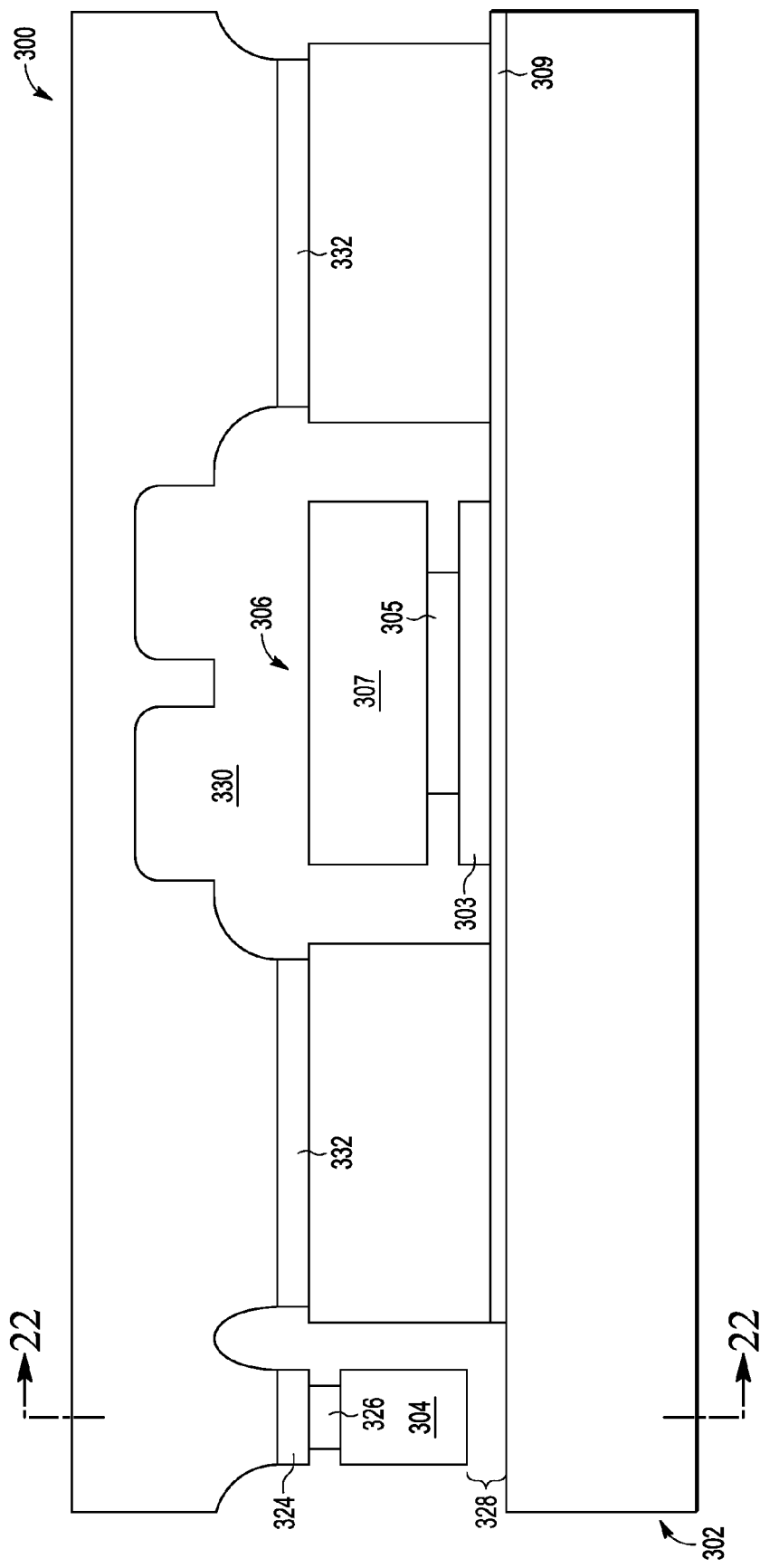

FIG. 20 illustrates a cross section view of the wafer pair, from the same perspective of FIG. 19, after formation of a eutectic bond between seal ring 322 and seal ring 308 to form a eutectic ring 332 surrounding cavity 330. Cavity 330 is a low pressure cavity surrounding MEMS device 306, similar to low pressure cavities 70 and 222. As with collapsible standoff structures 24, 26, 50, and 52, collapsible standoff structures 326 and 304 allow for alignment between seal rings 322 and 308 to be maintained. That is, since the collapsible standoff structures collapse due to pivot 342 and the force upon cantilever 304 and thus need not be removed, there is minimal risk of slipping or misalignment between the wafer pair. Therefore, the collapsible standoff structure allows for proper formation of cavity 330 by maintaining wafer separation while outgassing at a temperature above the eutectic temperature and by maintaining proper alignment for formation of the eutectic bond. Properly formed low pressure cavity 330 allows for improved performance and longevity of the MEMS device.

Therefore, by now it should be appreciated how collapsible structures are used to result in improved formation of low pressure cavities within a bonded wafer pair, which in turn may provide for improved performance and longevity of MEMS devices within the low pressure cavities. Note that the low pressure cavities may also include other devices which may benefit from such low pressure cavities other than or in addition to MEMS devices. The collapsible standoff structures allow for outgassing to be performed at a temperature greater than the eutectic temperature of the corresponding seal materials of the seal rings of the wafer pair by maintaining a separation between the wafer pair. This allows for reduced pressure within the bond chamber and improved outgassing. After the temperature is lowered to below the eutectic temperature, a force is used to collapse the collapsible standoff structures to bring the corresponding seal rings into contact. Since the collapsible standoff structures collapse and are thus not removed, slipping or misalignment of the wafer pair is reduced. Once the aligned seal rings are in contact, the temperature can again be raised to the eutectic temperature to form a eutectic ring, resulting in a low pressure cavity between the wafer pair.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under," "above," "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different types of MEMS devices may be included in each low pressure cavity having different structures that those examples illustrated in FIGS. 1-22. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a method of forming a multi-wafer structure using cap wafer and a device wafer each having a plurality of die includes forming a cavity in a die of the cap wafer; forming a first seal material around the cavity; forming a collapsible standoff structure around the cavity; forming a movable mass in a die of the device wafer; forming a second seal material around the movable mass that is alignable to the first seal material, wherein the first seal material and the second seal material are of materials that are able to form a eutectic bond at a eutectic temperature that is below the melting temperature of each of the first and second seal materials; arranging the cap wafer and the device wafer so that the first and second seals are aligned but separated by the collapsible standoff structure; performing an evacuation of gas from the cavity at a temperature above the eutectic temperature using a low pressure; after sufficient time to provide the evacuation of gas and while maintaining the low pressure, reducing the temperature so that the first and second seal materials are below the eutectic temperature; pressing the cap wafer and device wafer together with sufficient force to cause the first and second seal materials to be in contact; and raising the temperature of the first and second seal materials above the eutectic temperature to form the eutectic bond between the first and second seal materials. In one aspect, the pressing the cap wafer and device wafer together causes the collapsible standoff structure to be crushed; and the raising the temperature results in at least portions of the collapsible standoff structure being embedded in the eutectic bond. In another aspect, the first seal material comprises germanium and the second seal material comprises aluminum. In another aspect, the cavity includes a first sub-cavity, a second sub-cavity, and a travel stop between the first sub-cavity and the second sub-cavity. In another aspect, the forming the collapsible standoff structure includes depositing a first layer over the cap wafer having a first thickness; forming standoff openings in the first layer; forming a second layer, thinner than the first layer, in the standoff openings; removing portions of the second layer between the standoff openings to leave portions of the second layer in the openings to form the collapsible standoff structure; and removing the first layer. In a further aspect, the first layer includes oxide and the second layer includes polysilicon. In another further aspect, the standoff openings are in the region where the first and second seals will be aligned. In another further aspect, the standoff openings are spaced outside the region where the first and second seals will be aligned. In yet a further aspect, the method further includes forming a spacer opening in the cap wafer between the standoff openings and the region where the first and second seals will be aligned. In a further aspect, the eutectic bond is substantially free from portions of the collapsible standoff structure. In another aspect of the above one embodiment, the forming the collapsible standoff structure is further characterized as being further formed around the movable mass. In a further aspect, the forming the collapsible standoff structure includes forming a post and a cantilever that are aligned during the arranging the cap wafer and the device wafer. In an even further aspect, the cantilever is formed in the device wafer during the forming the movable mass. In an even further aspect, the post contacts the cantilever during the performing the evacuation of the gas and depresses the cantilever in response to the pressing the cap wafer and device wafer together.

In another embodiment, a multi-wafer structure having a cap wafer and a device wafer includes a cavity in a die of the cap wafer; a movable mass in a die of the device wafer and in the cavity; a eutectic bond contacting the cap wafer and the device wafer and sealing in a low pressure in the cavity; and a collapsed standoff structure around the cavity and contacting the cap wafer and the device wafer, wherein the collapsed standoff structure comprises one of a group consisting of fractured pieces in the collapsed structure and a post depressing a cantilever adjacent to the eutectic bond. In one aspect, the eutectic bond includes germanium and aluminum. In another aspect, the fractured pieces include polysilicon. In another aspect, the cantilever is of the same material is the movable mass. In another aspect, the structure further includes an opening in the device wafer adjacent to the eutectic bond on a side opposite that adjacent to the movable mass.

In yet another embodiment, a method of forming a MEMS device includes forming a cavity in a cap wafer; forming a movable mass in a device wafer; forming a first material surrounding the cavity; forming a second material surrounding the movable mass; forming a collapsible standoff; aligning the cap wafer and the device wafer so that the movable mass is in the cavity and the cap wafer and device wafer are held in separation by the collapsible standoff; reducing the pressure in the cavity with the aid of applying a heat greater than a eutectic temperature and of the first material and the second material; reducing the temperature below the eutectic temperature; contacting the first material and the second material with a force sufficient to collapse the collapsible standoff; and applying a temperature greater than the eutectic temperature to form a eutectic bond with the first material and the second material to seal in a low pressure in the cavity with the movable mass.

What is claimed is:

1. A method of forming a multi-wafer structure using cap wafer and a device wafer each having a plurality of die, comprising:
  forming a cavity in a die of the cap wafer;
  forming a first seal material around the cavity;

forming a collapsible standoff structure around the cavity;
forming a movable mass in a die of the device wafer;
forming a second seal material around the movable mass that is alignable to the first seal material, wherein the first seal material and the second seal material are of materials that are able to form a eutectic bond at a eutectic temperature that is below the melting temperature of each of the first and second seal materials;
arranging the cap wafer and the device wafer so that the first and second seals are aligned but separated by the collapsible standoff structure;
performing an evacuation of gas from the cavity at a temperature above the eutectic temperature using a vacuum pump;
after sufficient time to provide the evacuation of gas, reducing the temperature so that the first and second seal materials are below the eutectic temperature;
pressing the cap wafer and device wafer together with sufficient force to cause the first and second seal materials to be in contact; and
raising the temperature of the first and second seal materials above the eutectic temperature to form the eutectic bond between the first and second seal materials.

2. The method of claim 1, wherein:
the pressing the cap wafer and device wafer together causes the collapsible standoff structure to be crushed; and
the raising the temperature results in at least portions of the collapsible standoff structure being embedded in the eutectic bond.

3. The method of claim 1, wherein the first seal material comprises germanium and the second seal material comprises aluminum.

4. The method of claim 1, wherein the cavity comprises a first sub-cavity, a second sub-cavity, and a travel stop between the first sub-cavity and the second sub-cavity.

5. The method of claim 1, wherein the forming the collapsible standoff structure comprises:
depositing a first layer over the cap wafer having a first thickness;
forming standoff openings in the first layer;
forming a second layer, thinner than the first layer, in the standoff openings;
removing portions of the second layer between the standoff openings to leave portions of the second layer in the openings to form the collapsible standoff structure; and
removing the first layer.

6. The method of claim 5, wherein the first layer comprises oxide and the second layer comprises polysilicon.

7. The method of claim 5, wherein, the standoff openings are in the region where the first and second seals will be aligned.

8. The method of claim 5, wherein, the standoff openings are spaced outside the region where the first and second seals will be aligned.

9. The method of claim 8, further comprising forming a spacer opening in the cap wafer between the standoff openings and the region where the first and second seals will be aligned.

10. The method of claim 9, wherein,
the eutectic bond is substantially free from portions of the collapsible standoff structure.

11. The method of claim 1, wherein the forming the collapsible standoff structure is further characterized as being further formed around the movable mass.

12. The method of claim 11, wherein the forming the collapsible standoff structure comprises forming a post and a cantilever that are aligned during the arranging the cap wafer and the device wafer.

13. The method of claim 12, wherein the cantilever is formed in the device wafer during the forming the movable mass.

14. The method of claim 13, wherein the post contacts the cantilever during the performing the evacuation of the gas and depresses the cantilever in response to the pressing the cap wafer and device wafer together.

15. A method of forming a MEMS device, comprising:
forming a cavity in a cap wafer;
forming a movable mass in a device wafer;
forming a first material surrounding the cavity;
forming a second material surrounding the movable mass;
forming a collapsible standoff;
aligning the cap wafer and the device wafer so that the movable mass is in the cavity and the cap wafer and device wafer are held in separation by the collapsible standoff;
reducing pressure in the cavity with the aid of applying a heat greater than a eutectic temperature and of the first material and the second material;
reducing the temperature below the eutectic temperature;
contacting the first material and the second material with a force sufficient to collapse the collapsible standoff; and
applying a temperature greater than the eutectic temperature to form a eutectic bond with the first material and the second material to seal in the reduced pressure in the cavity with the movable mass.

* * * * *